US010340253B2

(12) United States Patent
Liao et al.

(10) Patent No.: US 10,340,253 B2
(45) Date of Patent: Jul. 2, 2019

(54) PACKAGE STRUCTURE AND METHOD OF MANUFACTURING THE SAME

(71) Applicant: Taiwan Semiconductor Manufacturing Co., Ltd., Hsinchu (TW)

(72) Inventors: Shu-Hang Liao, Hsinchu (TW); Chih-Wei Wu, Yilan County (TW); Jing-Cheng Lin, Hsinchu (TW); Szu-Wei Lu, Hsinchu (TW); Ying-Ching Shih, Hsinchu (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 0 days.

(21) Appl. No.: 15/716,506

(22) Filed: Sep. 26, 2017

(65) Prior Publication Data

US 2019/0096851 A1    Mar. 28, 2019

(51) Int. Cl.
*H01L 25/065* (2006.01)
*H01L 21/56* (2006.01)
*H01L 23/31* (2006.01)
*H01L 23/00* (2006.01)

(52) U.S. Cl.
CPC ........ *H01L 25/0655* (2013.01); *H01L 21/563* (2013.01); *H01L 23/3114* (2013.01); *H01L 23/3185* (2013.01); *H01L 24/03* (2013.01); *H01L 24/17* (2013.01); *H01L 24/81* (2013.01); *H01L 2224/0231* (2013.01); *H01L 2224/04105* (2013.01); *H01L 2924/15173* (2013.01); *H01L 2924/181* (2013.01)

(58) Field of Classification Search
CPC ............. H01L 23/3192; H01L 23/3157; H01L 23/3185; H01L 23/0655; H01L 23/563
See application file for complete search history.

(56) References Cited

U.S. PATENT DOCUMENTS

| 9,000,584 | B2 | 4/2015 | Lin et al. |
| 9,048,222 | B2 | 6/2015 | Hung et al. |
| 9,048,233 | B2 | 6/2015 | Wu et al. |
| 9,064,874 | B2 | 6/2015 | Edelstein et al. |
| 9,111,949 | B2 | 8/2015 | Yu et al. |
| 9,263,511 | B2 | 2/2016 | Yu et al. |
| 9,281,254 | B2 | 3/2016 | Yu et al. |
| 9,368,460 | B2 * | 6/2016 | Yu ........................... H01L 24/19 |

(Continued)

*Primary Examiner* — Wael M Fahmy
*Assistant Examiner* — Sarah K Salerno
(74) *Attorney, Agent, or Firm* — JCIPRNET

(57) ABSTRACT

A package structure and a method of manufacturing the same are provided. The package structure includes a first die, a second die, a first encapsulant, a bridge, an underfill layer and a RDL structure. The first die and the second die are placed side by side. The first encapsulant encapsulates sidewalls of the first die and sidewalls of the second die. The bridge electrically connects the first die and the second die through two conductive bumps. The underfill layer fills the space between the bridge and the first die, between the bridge and the second die, and between the bridge and a portion of the first encapsualnt. The RDL structure is located over the bridge and electrically connected to the first die and the second die though a plurality of TIVs. The bottom surfaces of the two conductive bumps are level with a bottom surface of the underfill layer.

20 Claims, 15 Drawing Sheets

(56) References Cited

U.S. PATENT DOCUMENTS

| | | | |
|---|---|---|---|
| 9,372,206 B2 | 6/2016 | Wu et al. | |
| 9,496,189 B2 | 11/2016 | Yu et al. | |
| 2016/0240457 A1* | 8/2016 | Lee | H01L 23/481 |
| 2018/0005987 A1* | 1/2018 | Hiner | H01L 23/5383 |

* cited by examiner

PACKAGE STRUCTURE AND METHOD OF MANUFACTURING THE SAME

BACKGROUND

The semiconductor industry has experienced rapid growth due to continuous improvements in the integration density of various electronic components (i.e., transistors, diodes, resistors, capacitors, etc.). For the most part, this improvement in integration density has come from continuous reductions in minimum feature size, which allows more of the smaller components to be integrated into a given area. These smaller electronic components also demand smaller packages that utilize less area than previous packages. Some smaller types of packages for semiconductor components include quad flat packages (QFPs), pin grid array (PGA) packages, ball grid array (BGA) packages, flip chips (FC), three-dimensional integrated circuits (3DICs), wafer level packages (WLPs), and package on package (PoP) devices and so on.

Currently, integrated fan-out packages are becoming increasingly popular for their compactness.

DETAILED DESCRIPTION

Figure 1A:
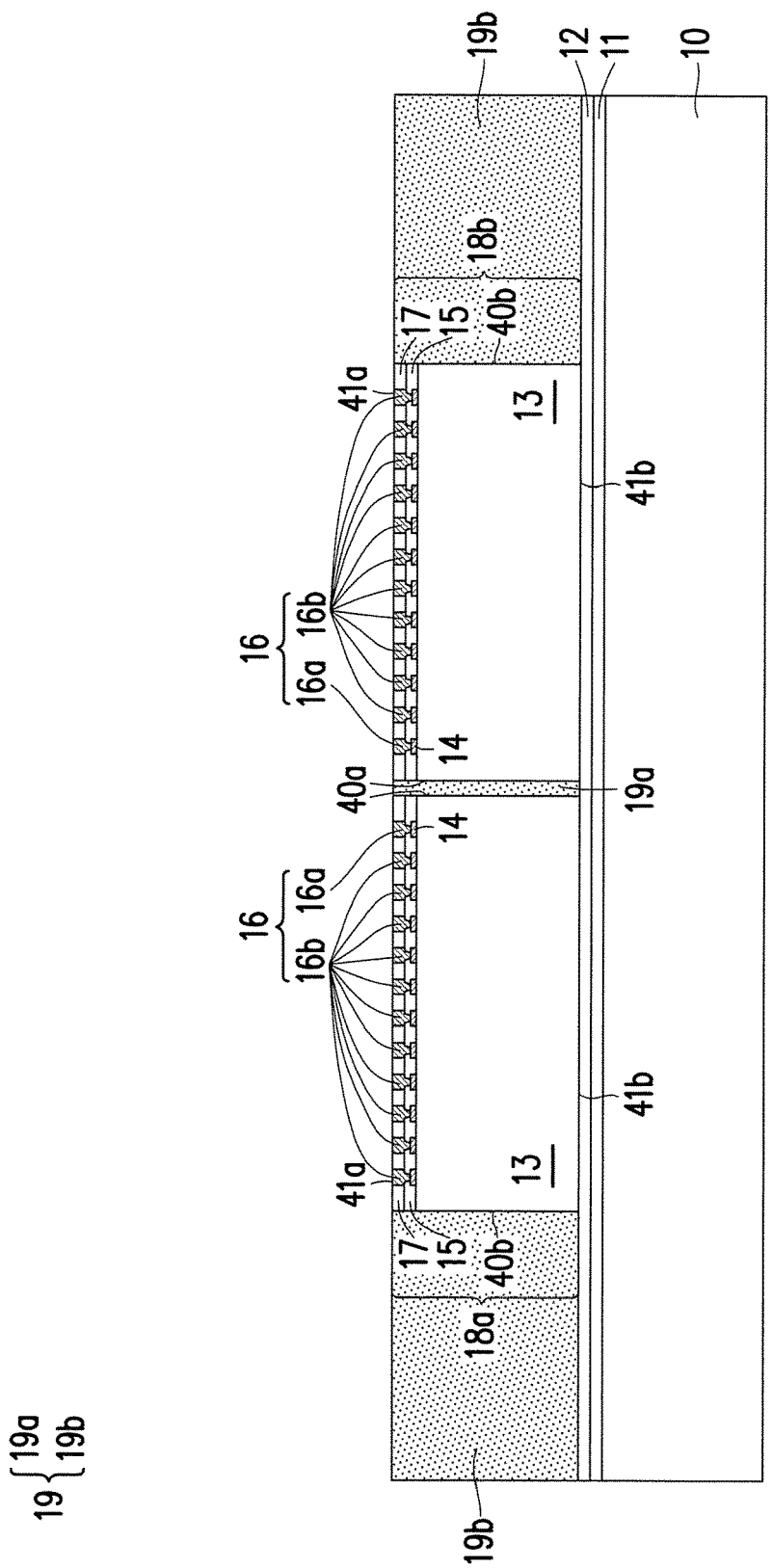
FIG. 1A to FIG. 1L are schematic cross-sectional views illustrating a method of manufacturing a package structure according to some embodiments of the disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a second feature over or on a first feature in the description that follows may include embodiments in which the second and first features are formed in direct contact, and may also include embodiments in which additional features may be formed between the second and first features, such that the second and first features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath", "below", "lower", "on", "above", "upper" and the like, may be used herein for ease of description to describe one element or feature's relationship to another element(s) or feature(s) as illustrated in the FIG.s. The spatially relative terms are intended to encompass different orientations of the device in use or operation in addition to the orientation depicted in the FIG.s. The apparatus may be otherwise oriented (rotated 90 degrees or at other orientations) and the spatially relative descriptors used herein may likewise be interpreted accordingly.

Other features and processes may also be included. For example, testing structures may be included to aid in the verification testing of the 3D packaging or 3DIC devices. The testing structures may include, for example, test pads formed in a redistribution layer or on a substrate that allows the testing of the 3D packaging or 3DIC, the use of probes and/or probe cards, and the like. The verification testing may be performed on intermediate structures as well as the final structure. Additionally, the structures and methods disclosed herein may be used in conjunction with testing methodologies that incorporate intermediate verification of known good dies to increase the yield and decrease costs.

FIG. 1A to FIG. 1L are schematic cross-sectional views illustrating a method of manufacturing a package structure according to some embodiments of the disclosure.

Referring to FIG. 1A, a carrier 10 is provided. The carrier 10 may be a glass carrier, a ceramic carrier, or the like. A de-bonding layer 11 is formed on the carrier 10 by, for example, a spin coating method. In some embodiments, the de-bonding layer 11 may be formed of an adhesive such as an Ultra-Violet (UV) glue, a Light-to-Heat Conversion (LTHC) glue, or the like, or other types of adhesives. The de-bonding layer 11 is decomposable under the heat of light to thereby release the carrier 10 from the overlying structures that will be formed in subsequent steps.

Still referring to FIG. 1A, a die 18a and a die 18b are attached side by side to the de-bonding layer 11 over the carrier 10 through an adhesive layer 12 such as a die attach film (DAF), silver paste, or the like. The die 18a and the die 18b may respectively be an application-specific integrated circuit (ASIC) chip, an analog chip, a sensor chip, a wireless and radio frequency chip, a voltage regulator chip or a memory chips. The die 18a and the die 18b may be the same types of dies or the different types of dies. In some embodiments, the two dies 18a and 18b are two small die partitions with different function of a larger single die. In some embodiments, the die 18a or 18b has a first side 40a and a second side 40b opposite to each other. The first side 40a is the side adjacent to another die 18b or 18a, and the second side 40b is the side far away from another die 18b or 18a.

In some embodiments, the die 18a and the die 18b have a similar structure. For the sake of brevity, the die 18a is taken for example. In some embodiments, the die 18a includes a substrate 13, a plurality of pads 14, a passivation layer 15, a plurality of connectors 16 and a passivation layer 17. In some embodiments, the substrate 13 is made of silicon or other semiconductor materials. Alternatively or additionally, the substrate 13 includes other elementary semiconductor materials such as germanium, gallium arsenic, or other suitable semiconductor materials. In some embodiments, the substrate 13 may further include other features such as various doped regions, a buried layer, and/or an epitaxy layer. Moreover, in some embodiments, the substrate 13 is made of an alloy semiconductor such as silicon germanium, silicon germanium carbide, gallium arsenic phosphide, or gallium indium phosphide. Furthermore, the substrate 13 may be a semiconductor on insulator such as silicon on insulator (SOI) or silicon on sapphire.

The pads 14 may be a part of an interconnection structure (not shown) and electrically connected to the integrated circuit devices (not shown) formed on the substrate 13. The passivation layer 15 is formed over the substrate 13 and covers a portion of the pads 14. A portion of the pads 14 is exposed by the passivation layer 15 and serves as an external connection of the die 18a. The connectors 16 are formed on and electrically connected to the pads 14 not covered by the passivation layer 15. The connector 16 includes solder bumps, gold bumps, copper bumps, copper posts, copper pillars, or the like. The passivation layer 17 is formed over the passivation layer 15 and aside the connectors 16 to cover the sidewalls of the connectors 16. The passivation layers 15 and 17 respectively include an insulating material such as silicon oxide, silicon nitride, polymer, or a combination thereof. The materials of the passivation 15 and the passivation layer 17 may be the same or different. In some embodiments, the top surface of the passivation layer 17 is substantially level with the top surface of the connectors 16. The die 18a has a first surface 41a and a second surface 41b opposite to each other. In some embodiments, the first surface 41a, that is, the top surfaces of the connectors 16 and the top surface of the passivation layer 17, is referred as an active surface of the die 18a. The second surface 41b is the bottom surface of the substrate 13, and is in contact with the adhesive layer 12.

In some embodiments, the connectors 16 include a connector 16a and a plurality of connectors 16b. The connector 16a is the connector adjacent to another die 18b/18a. That is to say, in some embodiments, the connector 16a of the die 18a is the rightmost connector of the die 18a, and the connector 16a of the die 18b is the leftmost connector of the die 18b, but the disclosure is not limited thereto.

Still referring to FIG. 1A, an encapsulant 19 is then formed over the carrier 10 and aside the dies 18a and 18b, so as to encapsulate the sidewalls of the dies 18a and 18b. In some embodiments, the encapsulant 19 includes a molding compound, a molding underfill, a resin such as epoxy, a combination thereof, or the like. In some other embodiments, the encapsulant 19 includes a photo-sensitive material such as polybenzoxazole (PBO), polyimide, benzocyclobutene (BCB), a combination thereof, or the like, which may be easily patterned by exposure and development processes or laser drilling process. In alternative embodiments, the encapsulant 19 includes nitride such as silicon nitride, oxide such as silicon oxide, phosphosilicate glass (PSG), borosilicate glass (BSG), boron-doped phosphosilicate glass (BPSG), a combination thereof, or the like. In some embodiments, the encapsulant 19 is formed by forming an encapsulant material layer over the carrier 10 by a suitable fabrication technique such as spin-coating, lamination, deposition, or similar processes. The encapsulant material layer encapsulates the top surfaces and sidewalls of the dies 18a and 18b. Thereafter, a grinding or polishing process is performed to remove a portion of the encapsulant material layer, such that the top surfaces of the dies 18a and 18b (that is, the top surfaces of the connectors 16) are exposed. In some embodiments, the top surfaces of the dies 18a and 18b and the top surface of the encapsulant 19 are substantially coplanar.

In some embodiments, the encapsulant 19 includes a first portion 19a and two second portions 19b. The first portion 19a is located between the two second portions 19b and between the die 18a and the die 18b. In other words, the first portion 19a is located at the first sides 40a of the dies 18a and 18b. The second portions 19b are located at the second sides 40b of the dies 18a and 18b.

Figure 1B:
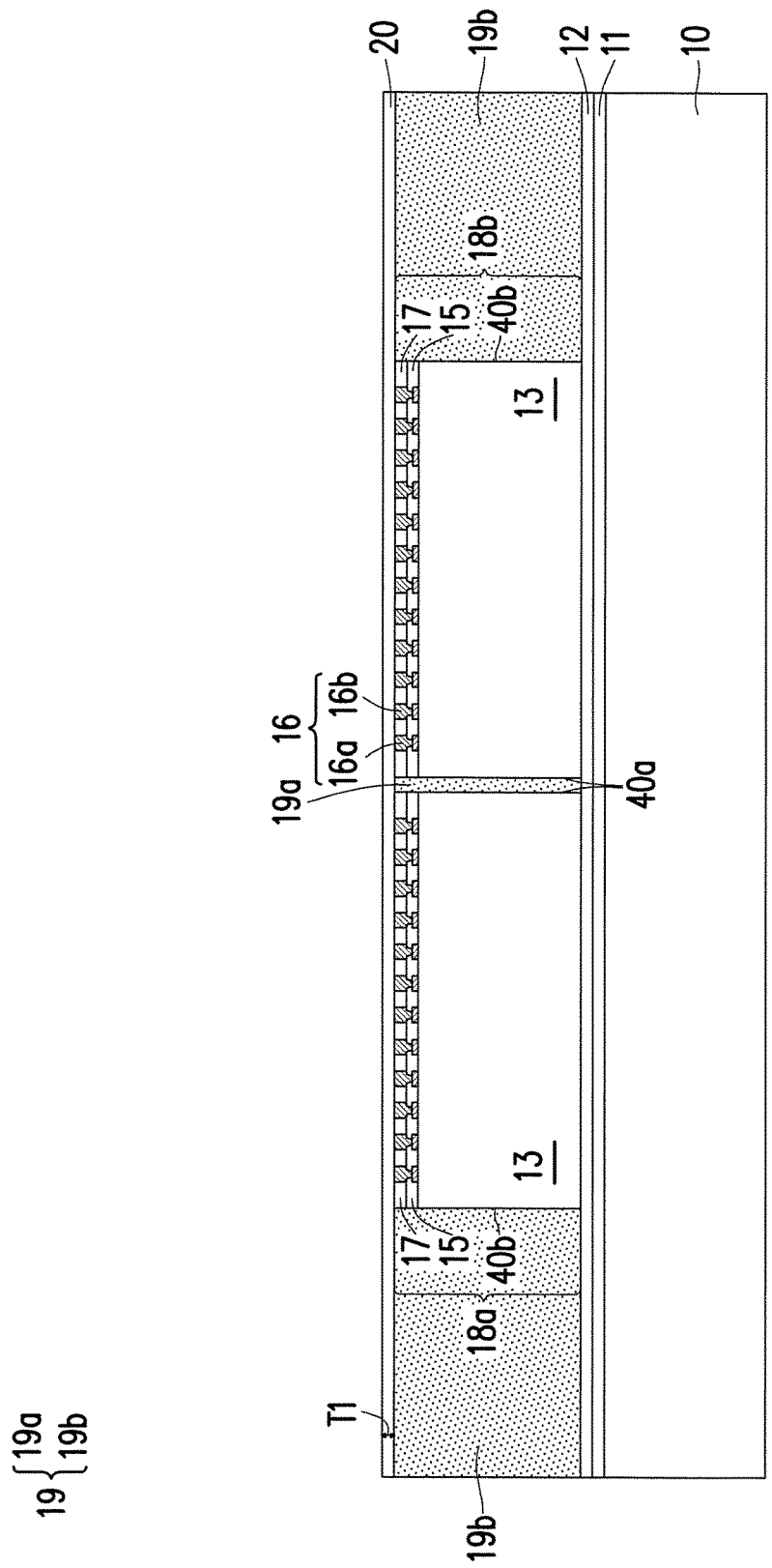

Referring to FIG. 1B, a dielectric layer 20 is formed on the two dies 18a and 18b and the encapsulant 19, so as to cover the top surfaces of the dies 18a and 18b and the top surface of the encapsulant 19. The dielectric layer 20 may be a single layer or a multilayer structure. The material of the dielectric layer 20 includes an inorganic dielectric material, an organic dielectric material, or a combination thereof. The inorganic dielectric material is, for example, silicon oxide, silicon nitride, silicon oxynitride, or a combination thereof. The organic dielectric material includes polymer. The polymer includes a photosensitive material, a non-photosensitive material, or a combination thereof. In some embodiments, the photosensitive material includes photosensitive polybenzoxazole (PBO), polyimide (PI), benzocyclobutene (BCB), a combination thereof, and/or the like. The non-photosensitive material includes Ajinomoto buildup film (ABF). The dielectric layer 20 may be formed by chemical vapor deposition, spin coating, lamination, or the like, or a combination thereof.

Figure 1C:
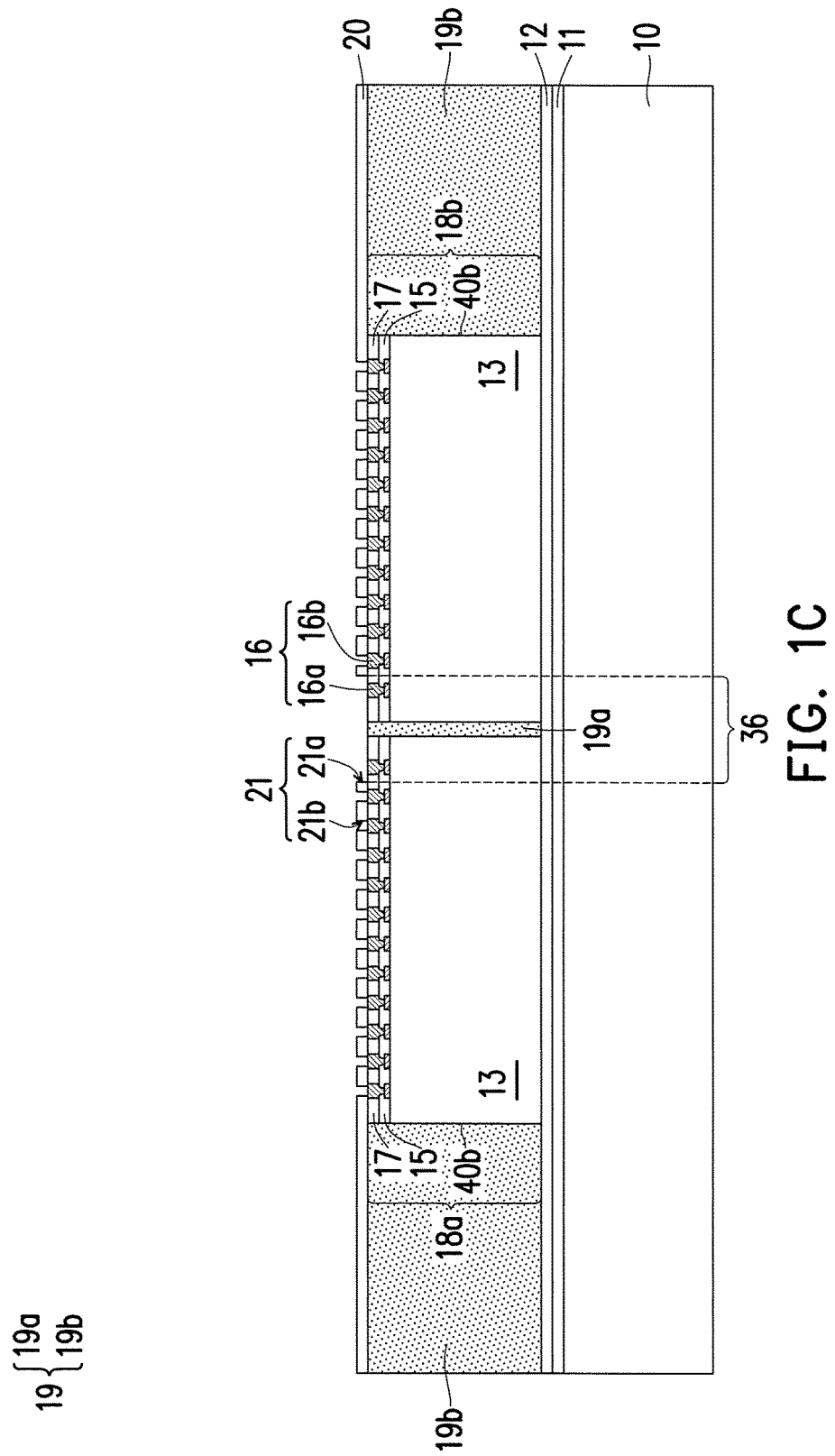

Referring to FIG. 1C, the dielectric layer 20 is patterned to form a plurality of openings 21. The patterning method includes exposure and development processes, lase drilling process, photolithography and etching processes, or a combination thereof. In some embodiments, the openings 21 include an opening 21a and a plurality of openings 21b. The opening 21a is located between the openings 21b, exposing the top surfaces of the connectors 16a of the dies 18a and 18b, portions of the top surfaces of the passivation layers 17, and the top surface of the first portion 19a of the encapsulant 19. It is mentioned that, one connector 16a of the die 18a or 18b is exposed by the opening 21a, but the disclosure is not limited thereto. In some other embodiments, two or more connectors 16a of the die 18a or 18b are exposed by the opening 21a. In some embodiments, the area exposed by the opening 21a is referred as a bridge joint area 36 for the subsequent processes. That is to say, in some embodiments, the dielectric layer 20 has a full opening 21a at the bridge joint area 36. The opening 21b is located over the connector 16b, and exposes a portion of the top surface of the connector 16b. In some embodiments, the width of the opening 21a is much greater than the width of the opening 21b. In some embodiments, the shape of the opening 21a and the shape of the opening 21b may be the same or different. In some embodiments, the opening 21a may be a trench exposing a plurality of connectors 16a arranged along a direction. The opening 21b may be a hole exposing one connector 16b, but the disclosure is not limited thereto.

Figure 1D:
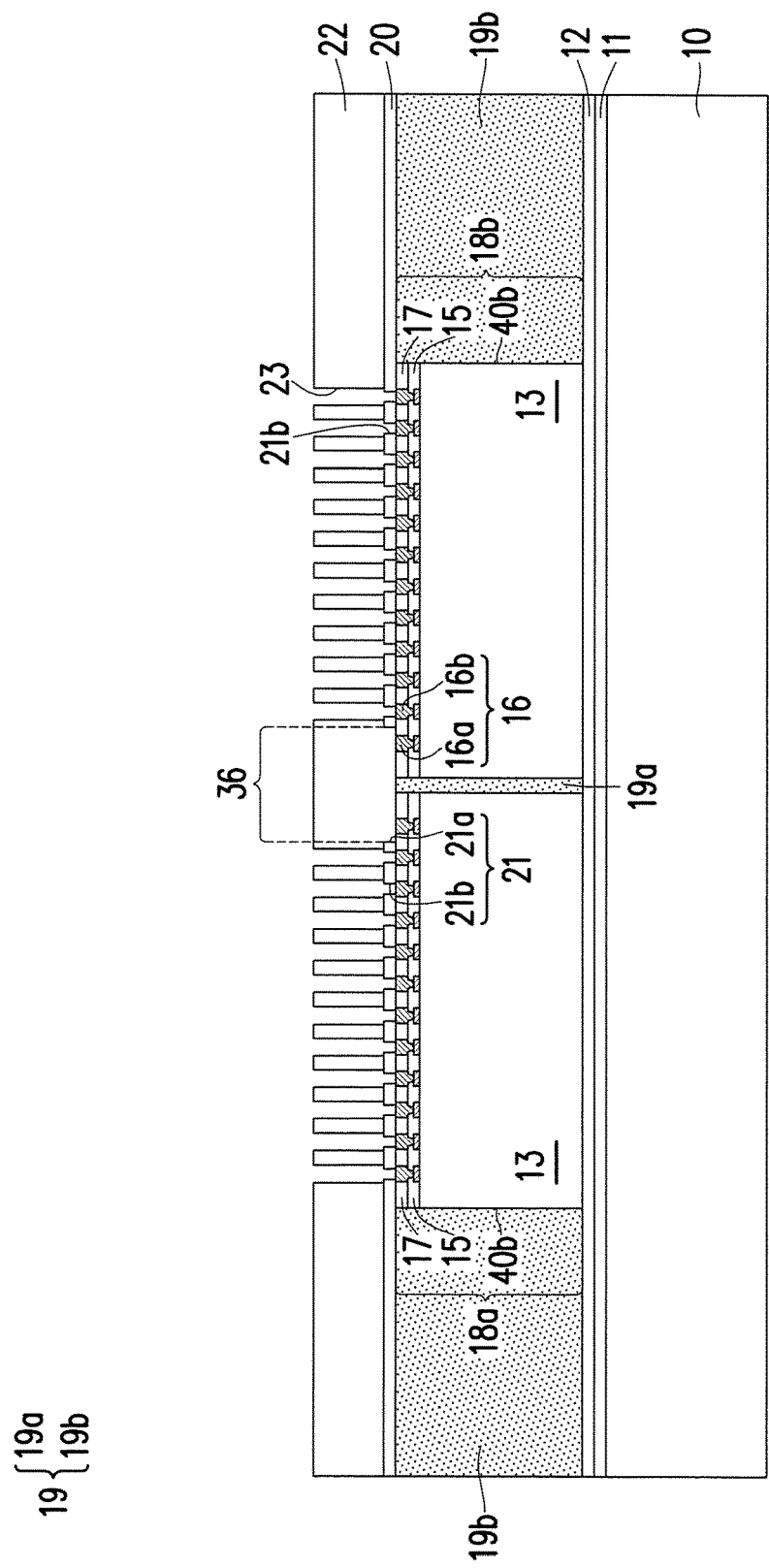

Referring to FIG. 1D, thereafter, a patterned mask 22 is formed over the dielectric layer 20. The patterned mask 22 has a plurality of openings 23. The openings 23 are located over and in spatial communication with the openings 21b of the dielectric layer 20. That is to say, the opening 23 and the opening 21b are overlapped. The cross-section shape of the opening 23 and the cross-section shape of the opening 21b may be the same or different. In some embodiments, the width of the opening 23 is greater than the width of the opening 21b, such that the openings 23 expose a portion of the top surface of the dielectric layer 20 and the top surfaces of connectors 16b exposed in the openings 21b. On the other hand, the bridge joint area 36 is covered by the patterned mask 22, that is, the top surfaces of the connectors 16a, portions of the top surfaces of the passivation layers 17 and the top surface of the first portion 19a of the encapsulant 19 are covered by the patterned mask 22.

Figure 1E:
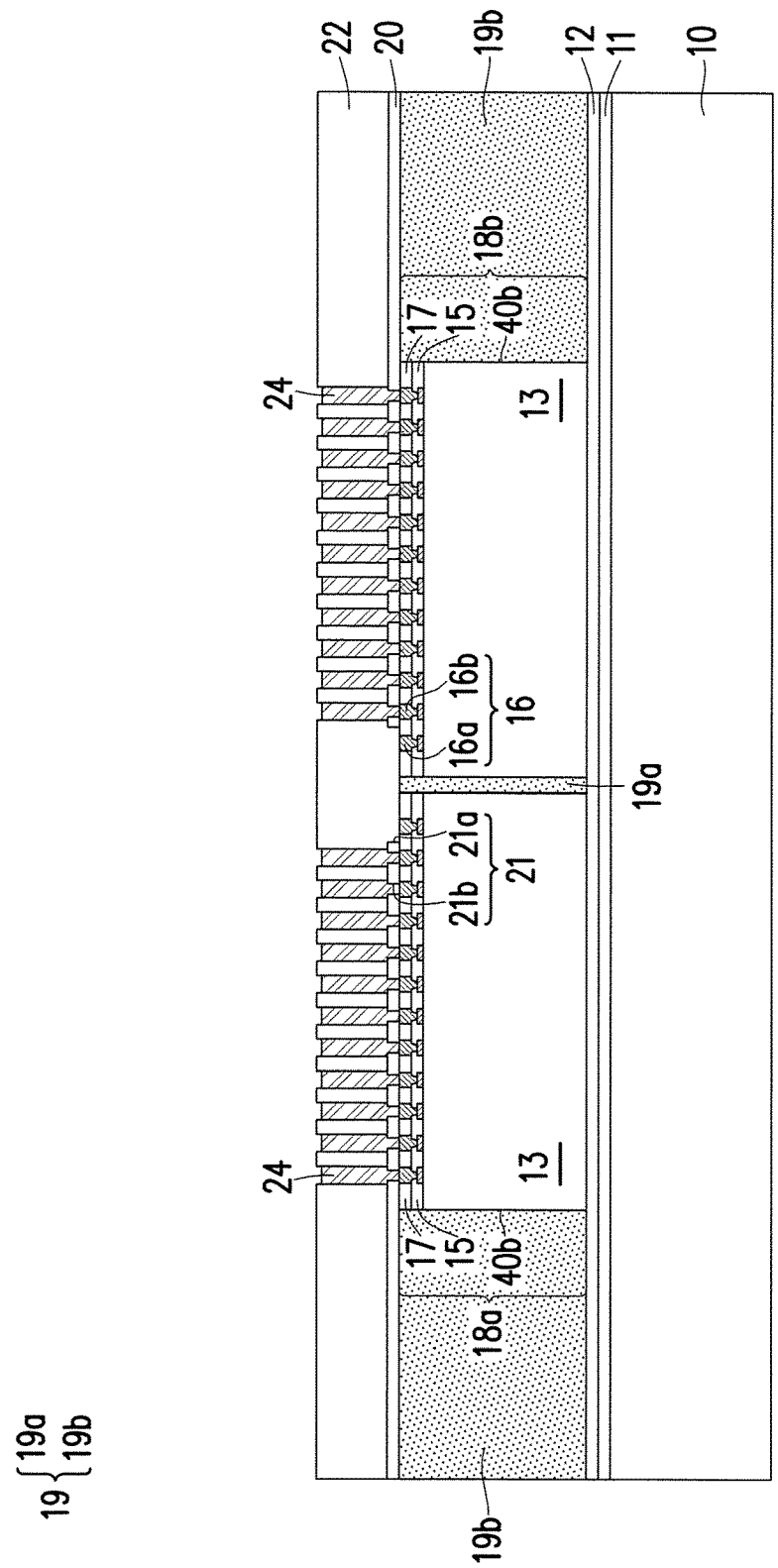

Referring to FIG. 1D and FIG. 1E, a plurality of through integrated fan-out vias (TIVs) 24 are formed in the openings 23 and the openings 21b and on the connectors 16b. The TIVs 24 penetrates through the dielectric layer 20 to be in electrical contact with the connectors 16b. In some embodiments, the TIVs 24 are formed extending along a direction perpendicular to the die 18a and 18b and the carrier 10. The sidewalls of the TIV 24 may be straight or inclined. The TIVs 24 include conductive materials such as copper, nickel, solder, alloys thereof, or the like, or a combination thereof. The TIVs 24 is formed by, electroplating, for example.

In some embodiments, the TIV 24 includes a seed layer and a conductive layer formed on the seed layer. The seed layer is, for example, a titanium or/and copper composited layer, and is formed by a sputtering or a suitable technique.

The seed layer is formed before the patterned mask 22 is formed and covers the top surface of the dielectric layer 20 and fills in the openings 21. After the patterned mask 22 is formed, the conductive layer (e.g., a copper layer) is formed on the seed layer exposed by the openings 23 and the openings 21b. Thereafter, the patterned mask layer 23 and the seed layer not covered by the conductive layer are removed in the subsequent process. In some embodiments, the seed layer is removed by an etching process with the conductive layer as a mask, for example. The conductive layer and the underlying seed layer form the TIV 24.

Figure 1F:
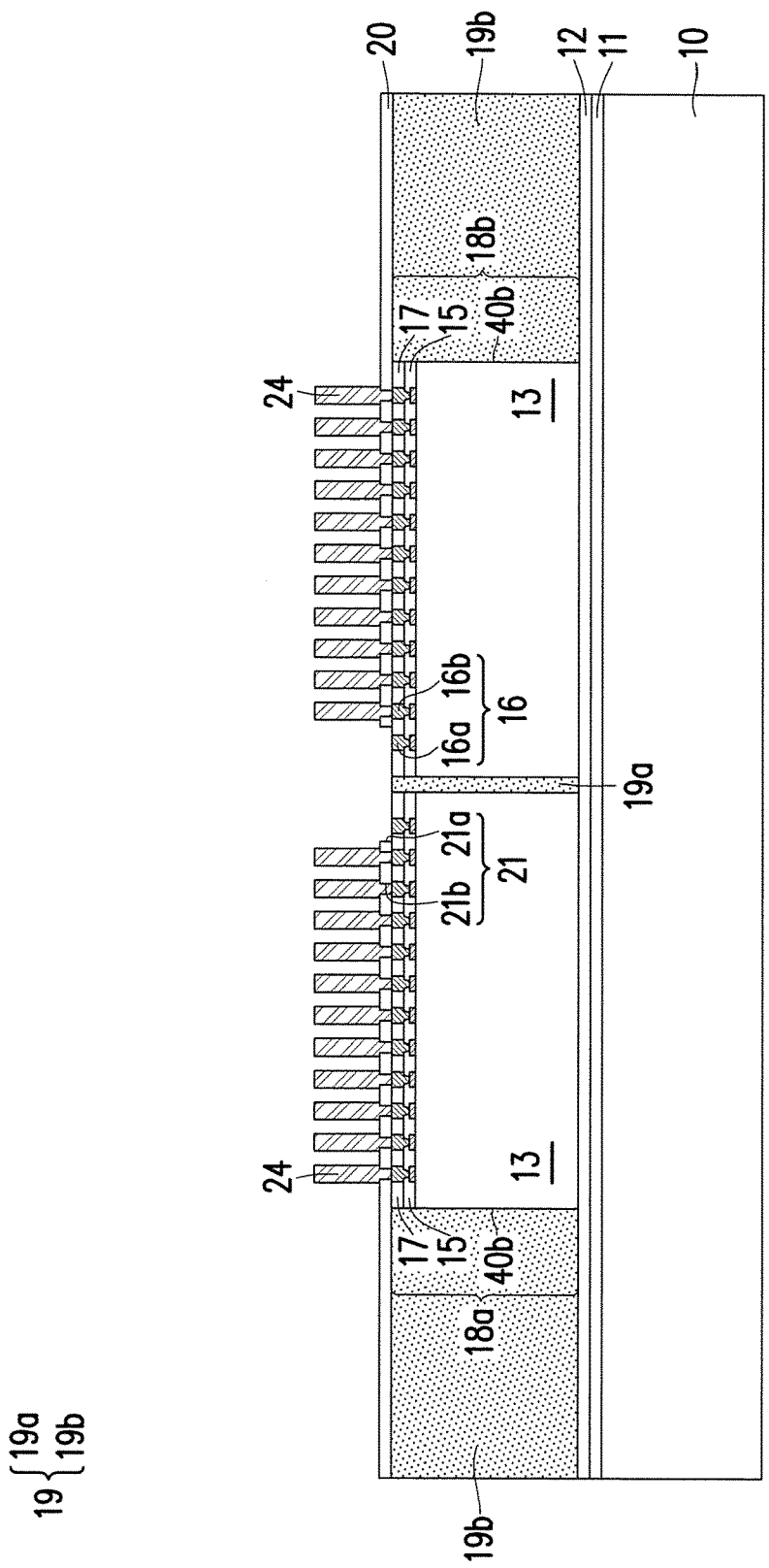

Referring to FIG. 1E and FIG. 1F, the patterned mask 22 is striped. The connectors 16a are exposed, and the connectors 16b are covered and connected to the TIVs 24. The TIVs 24 are located on the connectors 16b and protrudes from the dielectric layer 20.

Figure 1G:
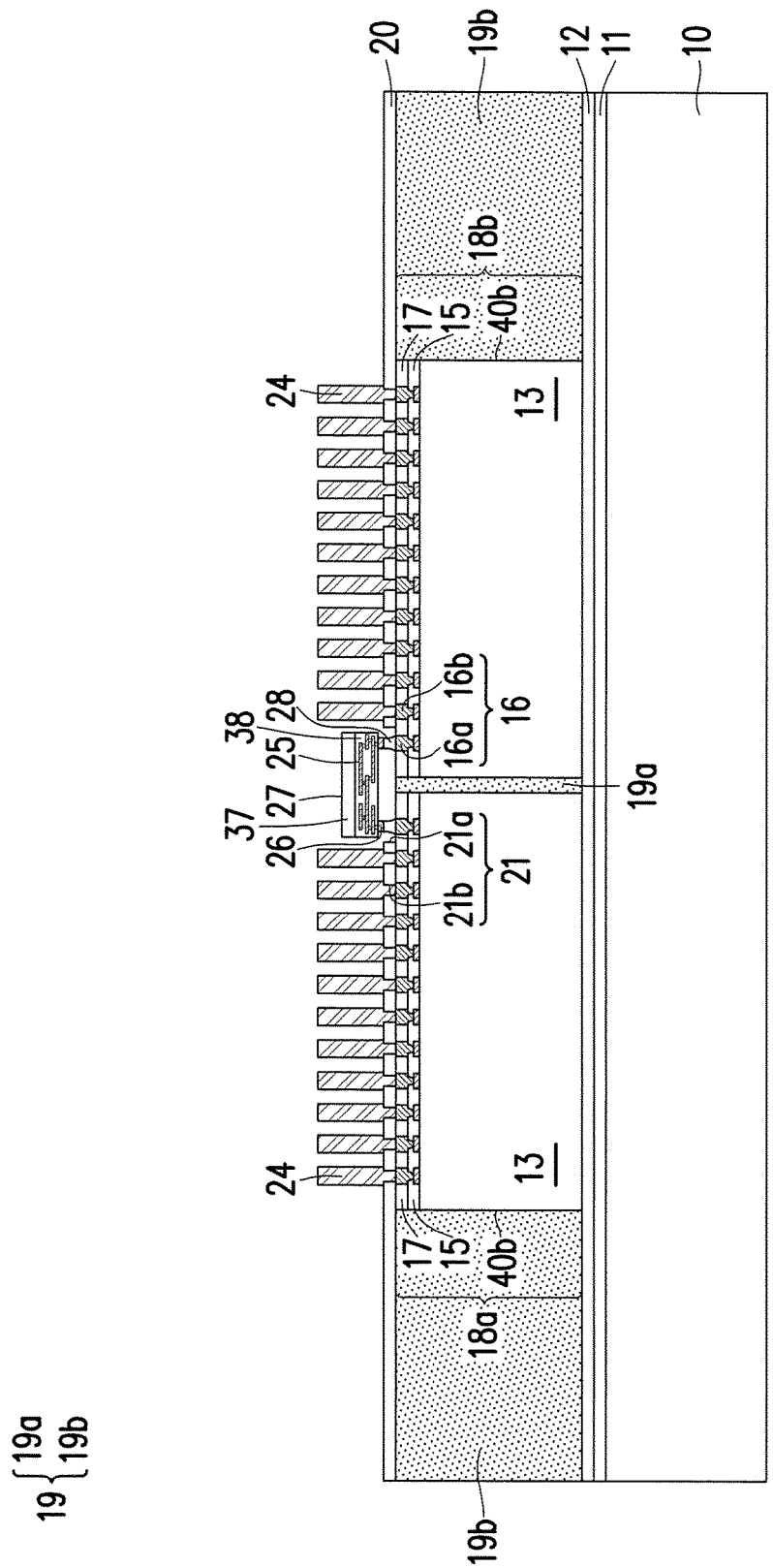

Referring to FIG. 1G, thereafter, a bridge 27 is placed over and connected to the connectors 16a of the dies 18a and 18b through conductive bumps 28. In other words, the two dies 18 are electrically connected through the conductive bumps 28 and the bridge 27. The number of the connectors 16a connected to the bridge 27 shown in FIG. 1G is merely for illustration, and the disclosure is not limited thereto. In some embodiments in which two or more connectors 16a of the die 18a or 18b is exposed by the opening 21a, two or more connector 16a of the die 18a or 18b are connected to the bridge 27. In some embodiments, the conductive bumps 28 are solder bumps, silver balls, copper balls, or any other suitable metallic balls. In some embodiments, a soldering flux (not shown) may be applied onto the conductive bumps 28 for better adhesion. In some embodiments, the bridge 27 is located between and surrounded by the TIVs 24. In some embodiments, the top surface of the bridge 27 is lower than the top surfaces of the TIVs 24, but the disclosure is not limited thereto. In some other embodiments, the top surface of the bridge 27 may be substantially level with the top surfaces of the TIVs 24. In some embodiments, the size of the bridge 27 is much less than the size of the die 18a and/or 18b. In other words, the width of the bridge 27 is much less than the width of the die 18a and/or 18b.

In some embodiments, the bridge 27 includes a substrate 37, an interconnection structure 25, a dielectric layer 38 and a plurality of pads 26. In some other embodiments, the bridge 27 further includes a passivation layer 45 around the pads 26 (shown in FIG. 2B). The passivation layer 45 covers the sidewalls of the pads 26.

In some embodiments, the substrate 37 may include materials the same as or different from those of the substrate 13. In some embodiments, the substrate 37 may be a semiconductor substrate, a polymer substrate, a dielectric substrate, a ceramic substrate, or a combination thereof. The semiconductor substrate is, for example, a doped silicon substrate, an undoped silicon substrate or a semiconductor-on-insulator (SOI) substrate. The doped silicon substrate may be P-type doped, N-type doped, or a combination thereof. The interconnection structure 25 is formed over the substrate 37 and is surrounded by the dielectric layer 38. The interconnection structure 25 is electrically connected to the dies 18a and 18b through the pads 26 and the conductive bumps 28. In other words, the pads 26 serve as an external connection of the bridge 27 and are electrically connected to the connectors 16a through the conductive bumps 28 therebetween. The material of the pads 26 and the material of the interconnection structure 25 may respectively include metal, metal compound, metal alloy or a combination thereof. Metal and metal compound may be copper, aluminum, tantalum, tungsten, tantalum nitride, titanium nitride, or a combination thereof. Metal alloy is, for example, alloys of tungsten, titanium or cobalt or an alloy made of nickel and polysilicon or a copper-aluminum alloy. The conductive bumps 28 are solder bumps, silver balls, copper balls, or any other suitable metallic balls.

In some embodiments, the bridge 27 may further include an active component, a passive component or a combination thereof. The active component includes transistors and/or diodes, for example. The passive component includes capacitor, resistor, inductor, and/or the like. However, the disclosure is not limited thereto, the bridge 27 may be any kind of components, as long as the bridge 27 electrically connects the two dies 18a and 18b. In some embodiments, except the interconnection structure 27, no active devices or integrated circuit devices are included in the bridge 27. In some exemplary embodiments, the bridge 27 is a blank chip without any other function except for electrically connecting the two dies 18a and 18b.

Figure 1H:
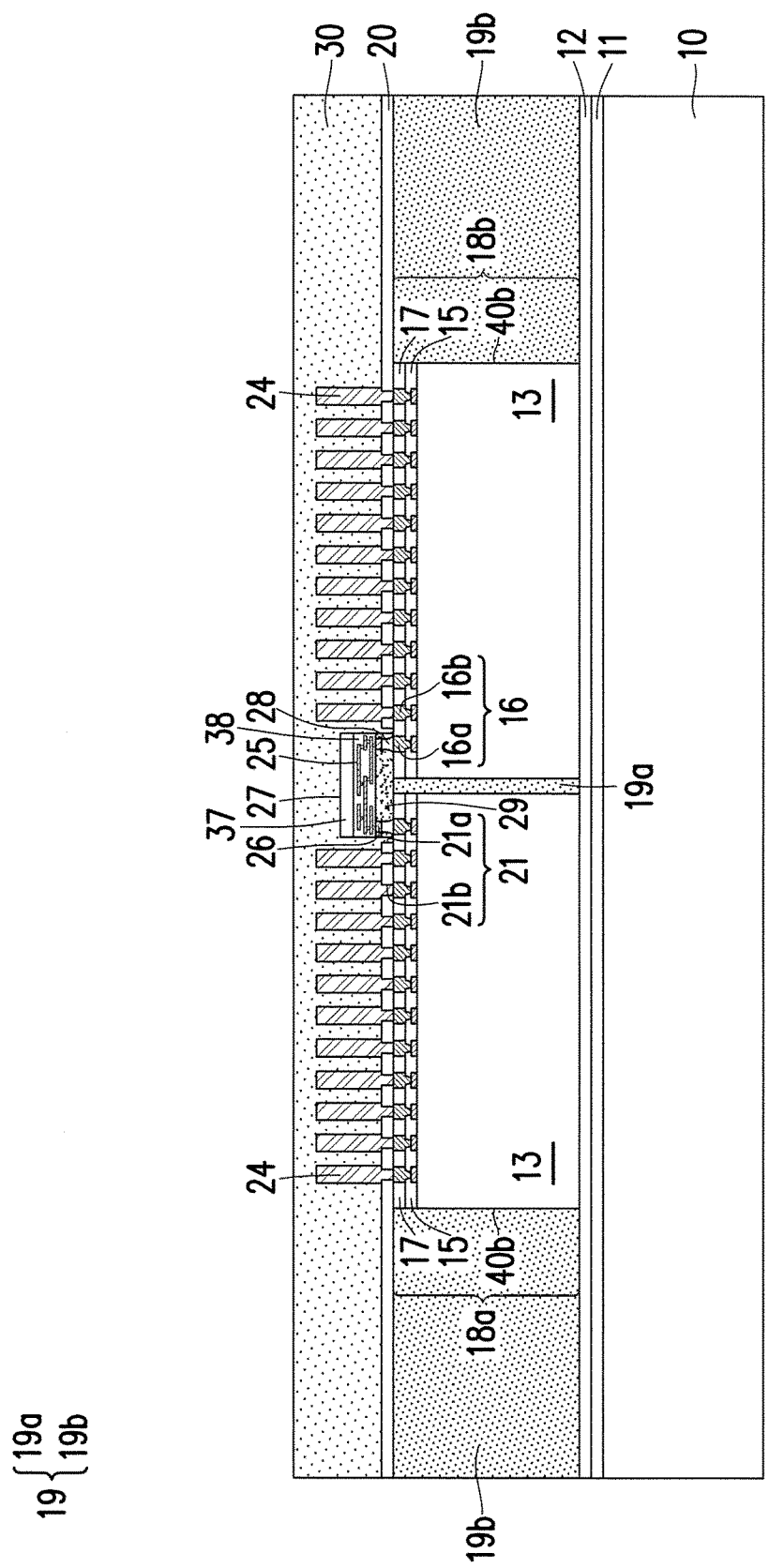
Figure 2A:
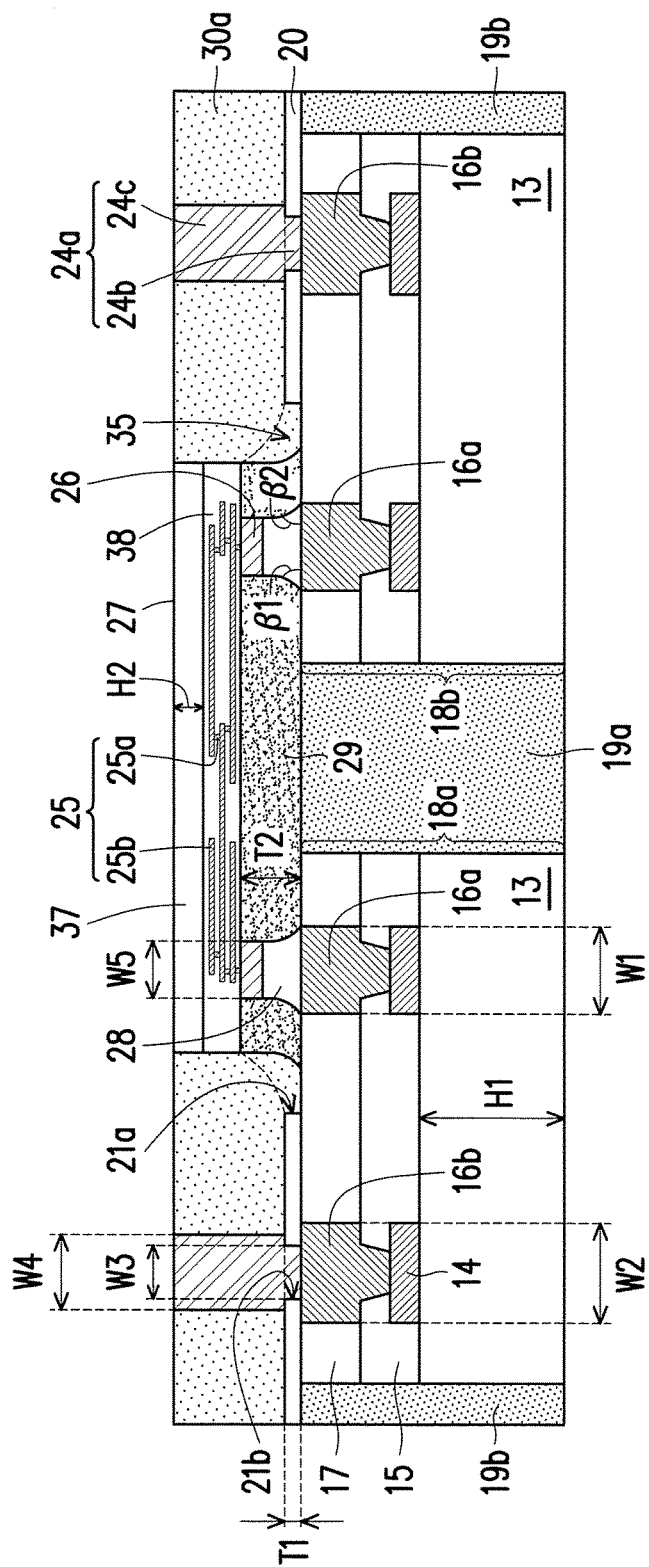
FIG. 2A to FIG. 2B are enlarged views of a portion of the structure showing in FIG. 1I.

Referring to FIG. 1H and FIG. 2A, in some embodiments, an underfill layer 29 is formed to fill the space between the bridge 27 and the die 18a, between the bridge 27 and the die 18b, between the bridge 27 and the first portion 19a of the encapsualnt 19 and surrounds the pads 26 and the conductive bumps 28. That is to say, the underfill layer 29 covers the bottom surface of the bridge 27, the sidewalls of the pads 26 and the sidewalls of the conducive bumps 28, the top surface of the first portion 19a of the encapsulant 19, and portions of the top surfaces of the passivation layers 17. In some embodiments, the underfill layer 29 further extends upward to cover portions of sidewalls of the bridge 27. The material of the underfill layer 29 may be different from or the same as the material of the dielectric layer 20. In some embodiments, the underfill layer 29 may be a polymer such as epoxy.

Still referring to FIG. 1H and FIG. 2A, thereafter, an encapsulant material layer 30 is formed over the dies 18a and 18b, so as to encapsulate the sidewalls and the top surfaces of the TIVs 24, the sidewalls of the underfill layer 29, the sidewalls and the top surfaces of the bridge 27. In some embodiments, the forming method and the material of the encapsulant material layer 30 may be similar to those of the encapsulant 19, which is not described again. In some embodiments, the material of the encapsulant 19 and the material of the encapsualnt material layer 30 may be the same or different.

Figure 1I:
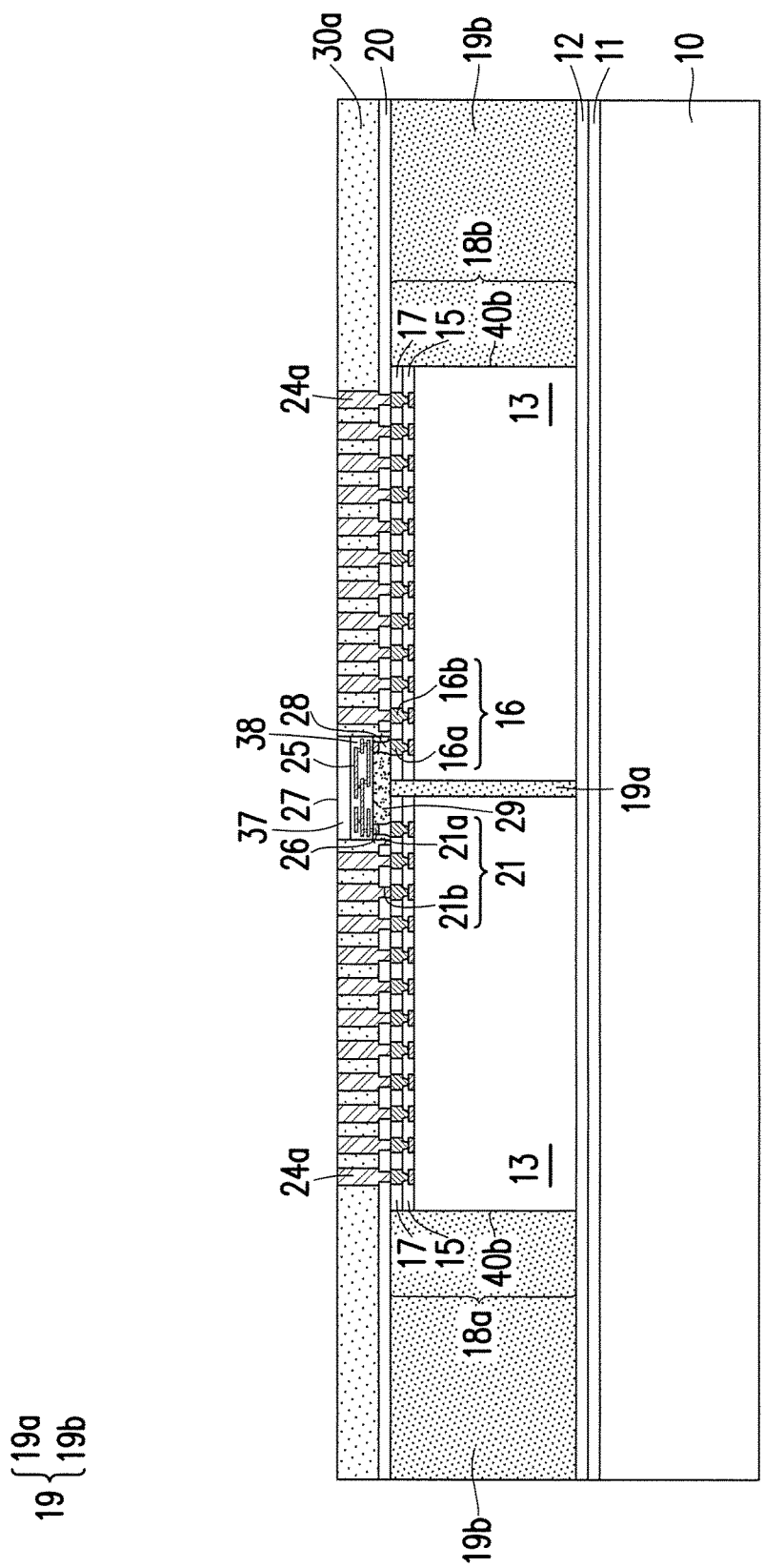

Referring to FIG. 1H and FIG. 1I, a grinding or polishing process such as a chemical mechanical polishing (CMP) process is performed, such that an encapsulant 30a and a plurality of TIVs 24a are formed, and the top surfaces of the TIVs 24a and the top surface of the bridge 27 are exposed. In some embodiments in which the top surface of the bridge 27 is lower than the top surface of the TIVs 24, a portion of the encapsulant material layer 30 over and aside the TIVs 24 and portions of the TIVs 24 are removed during the grinding or polishing process. In some other embodiments in which the top surface of the bridge 27 is substantially level with the top surface of the TIVs 24, a portion of the encapsulant material layer 30 over the TIVs 24 is removed, and the TIVs 24 are not removed during the grinding or polishing process.

Referring to FIG. 1I, the encapsulant 30a is aside the TIVs 24a, the bridge 27 and the underfill layer 29, and encapsulates the sidewalls of the TIVs 24a, the sidewalls of the bridge 27 and the sidewalls of the underfill layer 29. In some embodiments, the top surface of the TIVs 24a, the top surface of the encapsulant 30a and the top surface of the bridge 27 are substantially coplanar with each other.

Figure 2B:
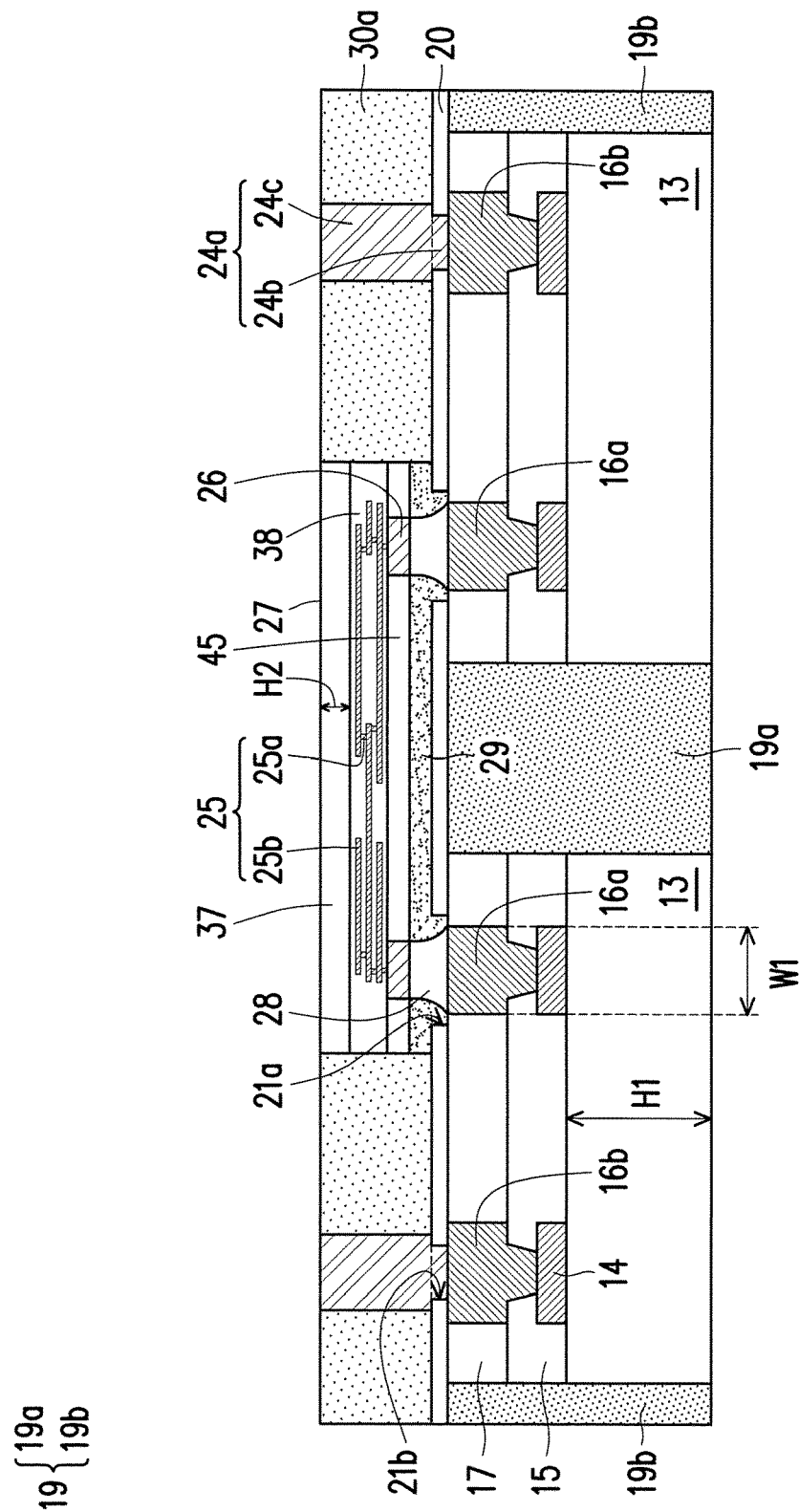

FIG. 2A to FIG. 2B are enlarged views of a portion of the structure shown in FIG. 1I. FIG. 2A and FIG. 2B illustrate the structural relationships and characteristics of the two dies 18a and 18b, the bridge 27, the underfill layer 29, the TIVs 24a and the dielectric layer 20. For the sake of brevity, the carrier 10, the de-bonding layer 11 and the adhesive layer 12 are not include in FIGS. 2A and 2B.

Referring to the FIG. 2A, the dies 18a and 18b respectively includes a connector 16a and a plurality of connectors 16b. For the sake of brevity, one connector 16b of the die 18a or 18b is shown in FIG. 2A. In some embodiments, the width W1 of the connector 16a is less than or equals to the width W2 of the connector 16b. The ratio of the width W2 to the width W1 ranges from 1 to 2.5. In some embodiments, the width W1 of the connector 16a ranges from 10 μm to 40 μm, the width W2 of the connector 16b ranges from 10 μm to 100 μm. In an exemplary embodiment, the width W1 of the connector 16a is 30 μm, and the width W2 of the connector 16b is 65 μm. In some embodiments, the height H1 of the substrate 13 of the die 18a or 18b ranges from 80 μm to 770 μm, and the height H2 of the substrate 37 of the bridge 27 ranges from 10 μm to 50 μm. In an exemplary embodiment, the height H1 of the substrate 13 is 600 μm, and the height H2 of the substrate 37 is 10 μm.

The dielectric layer 20 is located between the encapsulant 30a and the encapsulant 19b, and between the encapsulant 30a and the two dies 18a and 18b. In some embodiments, the thickness T1 of the dielectric layer 20 ranges from 3 μm to 15 μm. In an exemplary embodiment, the thickness T1 of the dielectric layer 20 is 5 μm. The dielectric layer 20 has a plurality of openings 21a and 21b. In some embodiments, the opening 21a of the dielectric layer 20 is located between the openings 21b, exposing the top surfaces of the connectors 16a of the dies 18a and 18b, a portion of the top surfaces of the passivation layer 17 around the connectors 16a, and the top surface of the first portion 19a of the encapsulant 19. However, the disclosure is not limited thereto. The opening 21b of the dielectric layer 20 is located over the connector 16b of the die 18a or 18b, exposing a portion of the top surface of the connector 16b.

The connector 16b of the die 18a or 18b is electrically connected to the TIV 24a. The TIVs 24a penetrates through the dielectric layer 20 to be in electrical contact with the connectors 16b of the dies 18a and 18b. In some embodiments, the TIV 24a includes an embedded part 24b and a protruding part 24c on the embedded part 24b. The embedded part 24b is located in the opening 21b of the dielectric layer 20. In some embodiments, the top surface of the embedded part 24b is substantially level with the top surface of the dielectric layer 20. In other words, the embedded part 24b is embedded in the dielectric layer 20. The protruding part 24c is located on the embedded part 24b and the dielectric layer 20 and surrounded by the encapsulant 30a. In some embodiments, the protruding part 24c covers the top surface of the embedded part 24b and a portion of the top surface of the dielectric layer 20, but the disclosure is not limited thereto. In some other embodiments, the protruding part 24c covers the top surface of the embedded part 24b and does not cover the top surface of the dielectric layer 20.

In some embodiments, the cross-section shapes of the embedded part 24b and the protruding part 24c may respectively be square, rectangle, trapezoid, or a combination thereof. The cross-section shape of the embedded part 24b may be the same as or different from the cross-section shape of the protruding part 24c. In some embodiments, the width W4 of the protruding part 24c is larger than the width W3 of the embedded part 24b, and less than, equals to or greater than the width W2 of the connector 16b. In some embodiments, the width W4 of the protruding part 24c ranges from 15 μm to 80 μm. The width W3 of the embedded part 24b ranges from 5 μm to 70 μm. In the exemplary embodiment, the width W4 of the protruding part 24c is 55 μm, the width W3 of the embedded part 24b is 45 μm.

The bridge 27 electrically connects the connector 16a of the die 18a and the connector 16a of the die 18b through the conductive bumps 28. The bridge 27 includes the pads 26 and the interconnection structure 25 electrically connected to each other. The pads 26 are located over the connector 16a. The pad 26 is at a position corresponding to the position of the connector 16a. In some embodiment, the center of the pad 26 is aligned with the center of the connector 16a, but the disclosure is not limited thereto. In some other embodiments, the pads 26 may shift from the position corresponding to the position of the connector 16a, that is, the center of the pad 26 is not aligned with the center of the connector 16a. In some embodiments, the width W5 of the pad 26 is less than the width W1 of the connector 16a, but the disclosure is not limited thereto.

In some embodiments, the interconnection structure 25 includes a plurality of vias 25a and a plurality of conductive line 25b. The vias 25a electrically connect the conductive lines 25b. It is understood that the vias 25a and the conductive lines 25b shown in FIG. 2A are merely for illustration, the actual positioning and configuration of the vias 25a and the conductive lines 25b may vary depending on design needs and manufacturing requirements. The material of the via 25a and the material of the conductive line 25b may be the same or different.

The conductive bump 28 is located between the connector 16a and the pad 26. In some embodiments, the conductive bump 28 covers the top surface of the connector 16a and the bottom surface of the pad 26. In some other embodiments, the conductive bump 28 may further cover a portion of sidewalls of the pad 26. The width of the top surface of the conductive bump 28 may be substantially the same as or greater than the width W5 of the pad 26. The width of the bottom surface of the conductive bump 28 may be substantially the same as or greater than the width W1 of the connector 16a.

In some embodiments, the width of the top surface (the surface in contact with the pad 26) of the conductive bump 28 may be less than, substantially equal to, or greater than the width of the bottom surface (the surface in contact with the connector 16a) of the conductive bump 28. The sidewalls of the conductive bump 28 may be straight or inclined. In some embodiments in which the sidewalls of the conductive bump 28 is inclined, the slopes of the two sidewalls may be the same or different. The conductive bump 28 may have a symmetrical structure or an asymmetric structure. In other words, in some embodiments, the cross-section shape of the conductive bump 28 includes trapezoid, trapezoid-like shaped, inverted trapezoid, square, rectangle, oval, parallelogram, or a combination thereof, but the disclosure is not limited thereto. In some embodiments, the base angle β1 and the base angle β2 of the conductive bump 28 may be the same or different, and at least one of the base angle β1 and the base angle β2 is an acute angle. In some embodiments, both the base angle β1 and the base angle β2 are acute angle. In some other embodiments, one of the base angle β1 and the base angle β2 is an acute angle, and another one of the base angle β1 and the base angle β2 is a right angle or an obtuse angle.

In some embodiments, the bottom surface of the underfill layer 29 covers and contacts with portions of the top surfaces of the passivation layers 17 and the top surface of the first portion 19a of the encapsulant 19. In some embodiments, the bottom surface of the underfill layer 29 is substantially level with the bottom surface of the dielectric layer 20. In some embodiments, the underfill layer 29 is not in contact with the dielectric layer 20, and a gap 35 is existed between the underfill layer 29 and the dielectric layer 20. In some other embodiments, the underfill layer 29 may be in contact with an end of the dielectric layer 20 to cover a sidewall of the dielectric layer 20 (shown as the dotted lines in FIG. 2A). In some embodiments, the underfill layer 29 may be in contact with a corner of the dielectric layer 20, so as to cover a sidewall and a portion of the top surface of the dielectric layer 20. In some embodiments, the thickness T2 of the underfill layer 29 is less than 20 μm. In some embodiments, the thickness T2 of the underfill layer ranges from 15 μm to 40 μm. In some embodiments, the thickness T2 is greater than the thickness T1 of the dielectric layer 20. In some exemplary embodiments, a ratio of the thickness T2 to the thickness T1 is about 3 to 8.

In some embodiments in which the underfill layer 29 is not in contact with the dielectric layer 20, the encapsulant 30a covers a portion of the top surface of the dielectric layer 20, and fills into the gap 35 between the underfill layer 29 and the dielectric layer 20 to cover a portion of the top surface of the passivation layer 17. In some embodiments in which the underfill layer 29 is in contact with the dielectric layer 20, the encapsulant 30a covers a portion of the top surface of the dielectric layer 20 and does not cover the top surface of the passivation layer 17.

Referring to FIG. 2B, in some other embodiments, the dielectric layer 20 is patterned to form two openings 21a and a plurality of openings 21b. The openings 21b are respectively formed over the connectors 16b of the dies 18a and 18b as described above. The two openings 21a are respectively formed over the connectors 16a of the dies 18a and 18b, and the width of the opening 21a is greater than the width W1 of the connector 16a. That is to say, the openings 21a exposes the top surfaces of the connectors 16a and a portion of the top surfaces of the passivation layer 17 around the connectors 16a. In this embodiment, the top surface of the first portion 19a of the encapsulant 19 is covered by the dielectric layer 20. In some embodiments, the bridge 27 includes a passivation layer 45 around the pads 26. The passivation layer 45 covers the sidewalls of the pads 26.

Figure 1J:
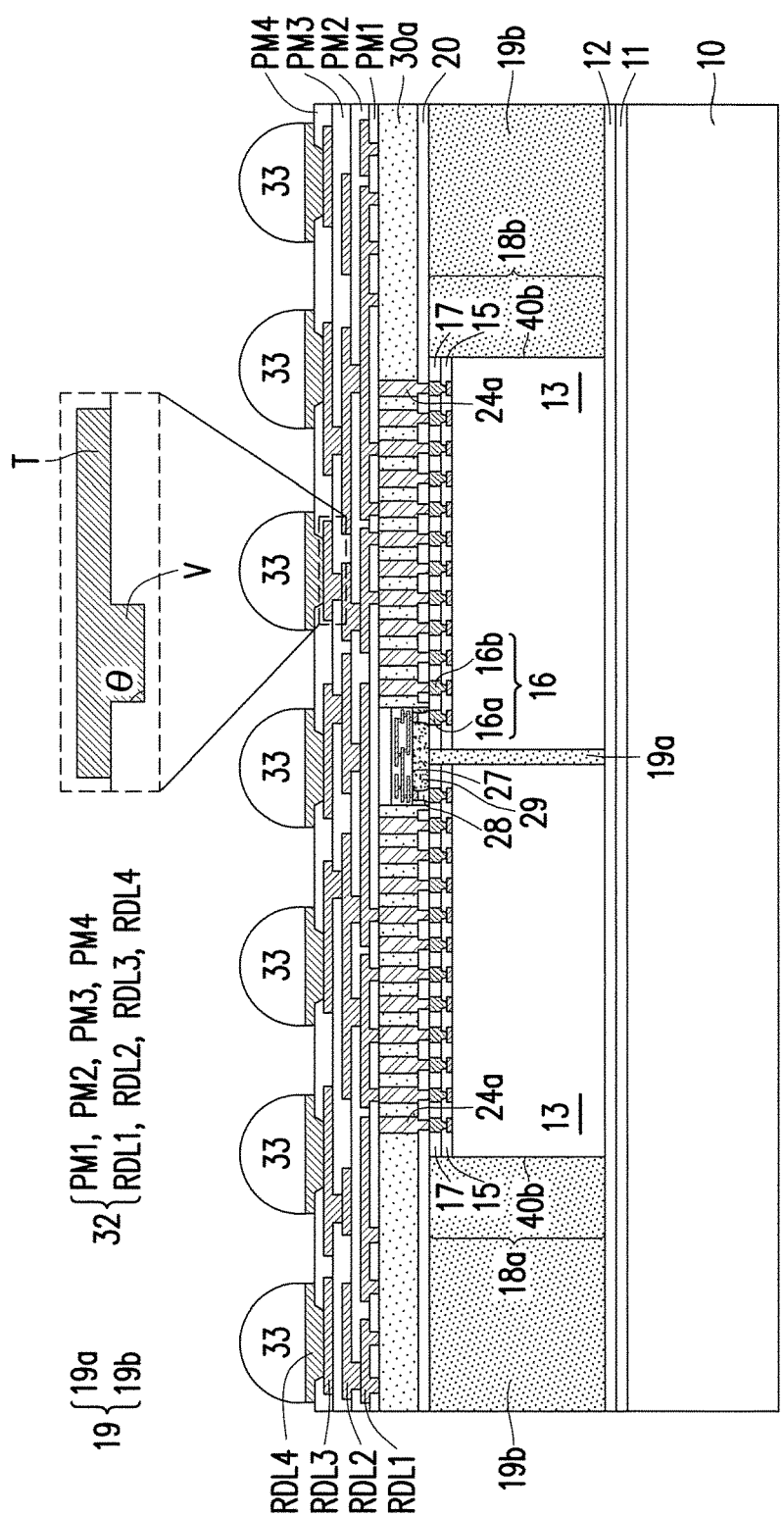

Referring to FIG. 1J, a redistribution layer (RDL) structure 32 is formed on the encapsulant 30a, the TIVs 24a and the bridge 27. The RDL structure 32 is electrically connected to the TIVs 24a, such that the two dies 18a and 18b are electrically connected through the TIVs 24a and the RDL structure 32. In some embodiments, the RDL structure 32 includes a plurality of polymer layers PM1, PM2, PM3 and PM4 and a plurality of redistribution layers RDL1, RDL2, RDL3 and RDL4 stacked alternately.

In some embodiments, the redistribution layer RDL1 penetrates through the polymer layer PM1 to be electrically connected to the TIVs 24a, and the bottom surface of the redistribution layer RDL1 and the bottom surface of the polymer layer PM1 are substantially level with each other. The redistribution layer RDL2 penetrates through the polymer layer PM2 and is electrically connected to the redistribution layer RDL1. The redistribution layer RDL3 penetrates through the polymer layer PM3 and is electrically connected to the redistribution layer RDL2. The redistribution layer RDL4 penetrates through the polymer layer PM4 and is electrically connected to the redistribution layer RDL3.

In some embodiments, the redistribution layers RDL1, RDL2, RDL3 and RDL4 respectively includes a plurality of vias V and a plurality of traces T connected to each other. The vias V penetrates through the polymer layers PM1, PM2, PM3 and PM4 to connect the traces T of the redistribution layers RDL1, RDL1, RDL3 and RDL 4, and the traces T are respectively located on the polymer layers PM1, PM2, PM3 and PM 4, and are respectively extending on the top surface of the polymer layers PM1, PM2, PM3 and PM4.

Referring to the enlarged view of the via V and the trace T, in some embodiments, the cross-section shape of the via V is square, rectangle or inverted trapezoid. In some embodiments, the base angle θ of the via V is an obtuse angle or a right angle.

In some embodiments, the polymer layers PM1, PM2, PM3 and PM4 respectively includes a photo-sensitive material such as polybenzoxazole (PBO), polyimide (PI), benzocyclobutene (BCB), a combination thereof or the like. The forming methods of the polymer layers PM1, PM2, PM3 and PM4 include suitable fabrication techniques such as spin coating, chemical vapor deposition (CVD), plasma-enhanced chemical vapor deposition (PECVD), lamination or the like. In some embodiments, the redistribution layers RDL1, RDL2, RDL3 and RDL4 respectively includes conductive materials. The conductive material includes metal such as copper, nickel, titanium, a combination thereof or the like, and is formed by an electroplating process. In some embodiments, the redistribution layers RDL1, RDL2, RDL3 and RDL4 respectively includes a seed layer (not shown) and a metal layer formed thereon (not shown). The seed layer may be a metal seed layer such as a copper seed layer. In some embodiments, the seed layer includes a first metal layer such as a titanium layer and a second metal layer such as a copper layer over the first metal layer. The metal layer may be copper or other suitable metals. In some embodiments, the redistribution layer RDL4 is also referred as under-ball metallurgy (UBM) layer for ball mounting.

The number of the polymer layers PM1, PM2, PM3 and PM4 or the redistribution layers RDL1, RDL2, RDL3 and RDL4 shown in FIG. 1J is merely for illustration, and the disclosure is not limited thereto. In some embodiments, as the connectors 16a of the dies 18a and 18b are connected through the bridge 27, the number of the redistribution layers may be reduced.

Thereafter, a plurality of connectors 33 are formed over and electrically connected to the redistribution layer RDL4 of the RDL structure 32. In some embodiments, the connectors 33 are referred as conductive terminals. In some embodiments, the material of the connector 33 includes copper, aluminum, lead-free alloys (e.g., gold, tin, silver, aluminum, or copper alloys) or lead alloys (e.g., lead-tin alloys). The connector 33 may be formed by a suitable process such as evaporation, plating, ball drop, screen printing, or a ball mounting process. The connectors 33 are electrically connected to the two dies 18a and 18b through the RDL structure 32 and the TIVs 24a.

Figure 1K:
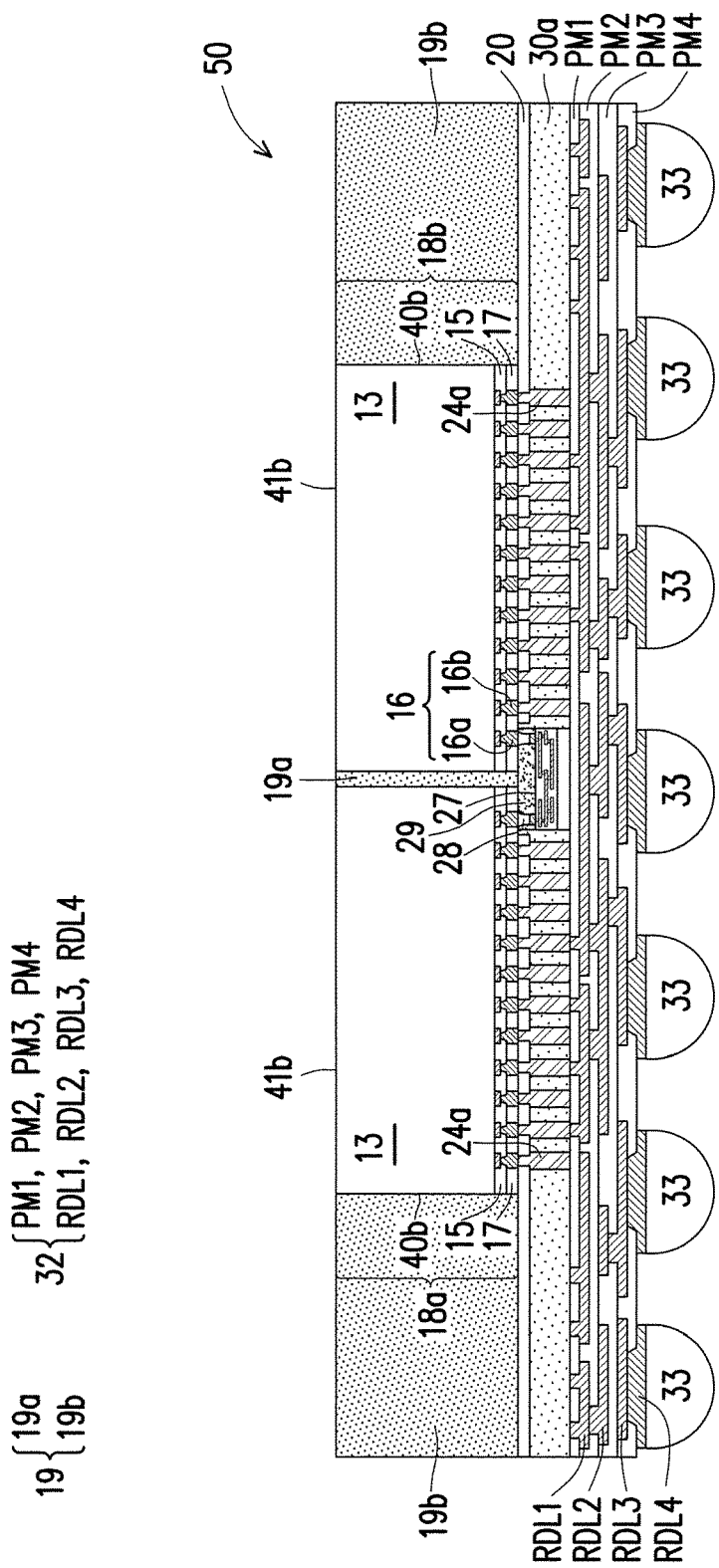

Referring to FIG. 1J and FIG. 1K, thereafter, the structure shown in FIG. 1J is turned over. The de-bonding layer 11 is decomposed under the heat of light, and the carrier 10 is then released. The adhesive layer 12 is removed by, for example, a cleaning process. In some embodiments, the second surfaces 41b of the substrates 13 of the two dies 18a and 18b and the encapsulant 19 are exposed.

Referring to FIG. 1K, the package structure 50 is thus completed. The package structure 50 includes two dies 18a and 18b, the TIVs 24a, the bridge 27, the RDL structure 32 and the connectors 33. The two dies 18a and 18b are electrically connected through the bridge 27, the TIVs 24a and the RDL structure 32. In other words, the connectors 16a of the dies 18a and 18b are connected through the bridge 27, the connectors 16b of the dies 18a and 18b are connected through the TIVs 24a and the RDL structure 32. In some embodiments, the package structure 50 may further connected to other package structures to form a package on package (PoP) device.

Figure 1L:
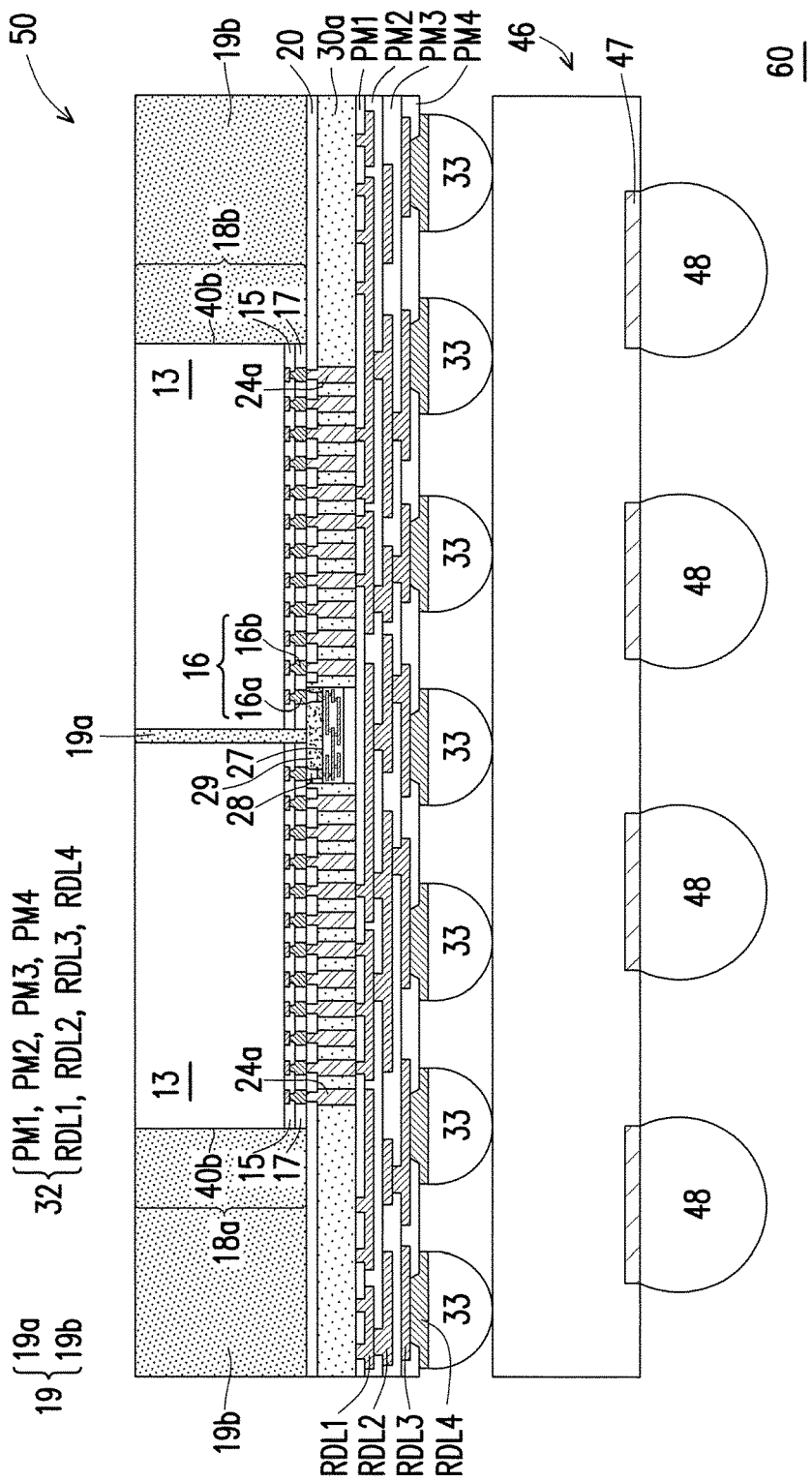

Referring to FIG. 1L, in some embodiments, the package structure 50 is placed on a package structure such as an integrated circuit (IC) device 46 to form a PoP device 60. The package structure 50 is electrically coupled to the IC device 46 through the connectors 33. In some embodiments, the IC device 46 includes a plurality of pads 47 and a plurality of connectors 48 electrically connected to each other. In some embodiments, the connectors 48 are referred as conductive terminals. The connectors 48 are used as an external connection of the PoP device 60. In some embodiments, thereafter, the PoP device may be connected to other package components such as a printed circuit board (PCB), a flex PCB, or the like through the connectors 48.

Figure 3:
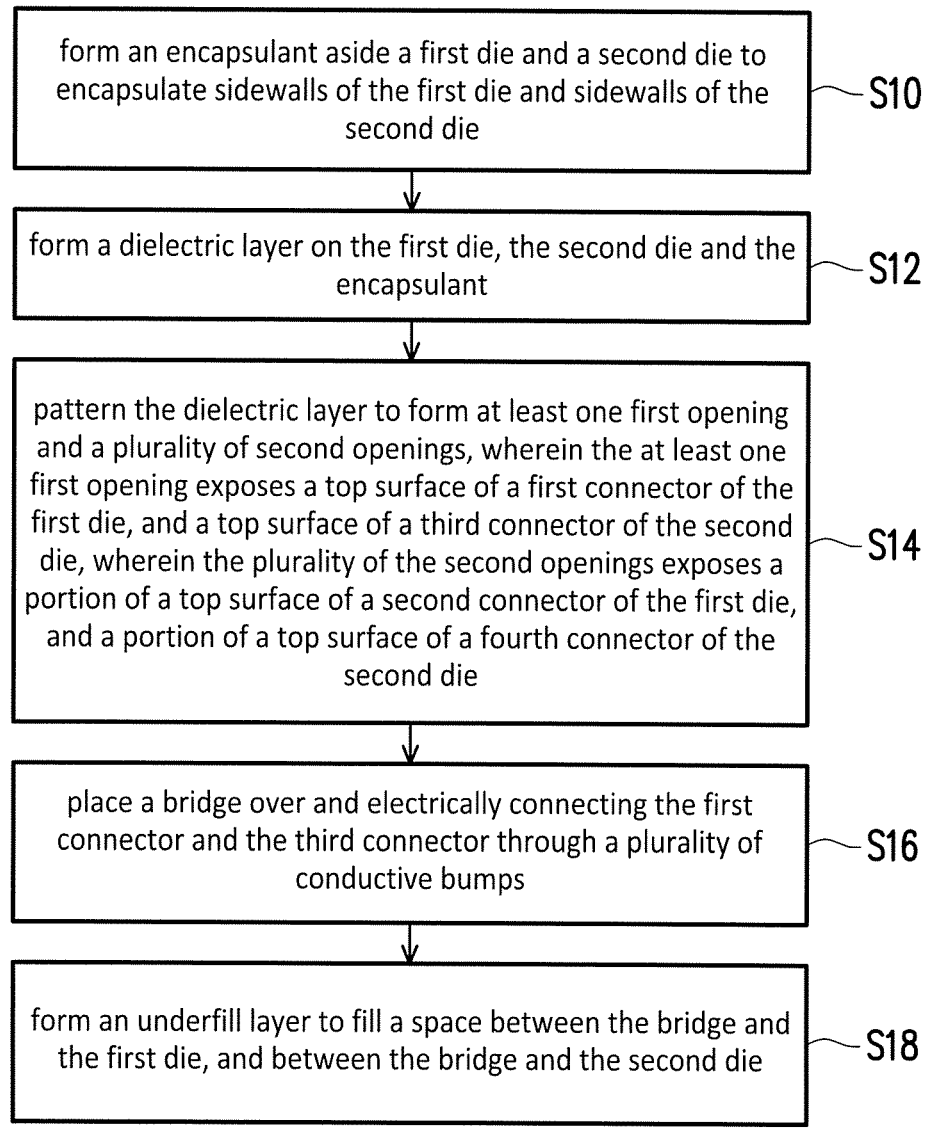
FIG. 3 is a flowchart of a method of manufacturing a package structure according to some embodiments of the disclosure.

FIG. 3 is a flowchart of a method of manufacturing a package structure according to some embodiments of the disclosure. Referring to FIG. 3, FIGS. 1A to 1C, and FIGS. 1G to 1H, first, in step S10, as shown in FIG. 1A, an encapsulant 19 is formed aside a first die 18a and a second die 18b, so as to encapsulate sidewalls of the first die 18a and sidewalls of the second die 18b. Next, in step S12, as shown in FIG. 1B, a dielectric layer 20 is formed on the first die 18a, the second die 18b and the encapsulant 19. Thereafter, in step S14, as shown in FIG. 1C, the dielectric layer 20 is patterned to form at least one first opening 21a and a plurality of second openings 21b, wherein the at least one first opening 21a exposes a top surface of a first connector 16a of the first die 18a, and a top surface of a third connector 16a of the second die 18b, wherein the plurality of the second openings 21b exposes a portion of a top surface of a second connector 16b of the first die 18a, and a portion of a top surface of a fourth connector 16b of the second die 18b. In step S16, as shown in FIG. 1G, a bridge 27 is placed over and electrically connecting the first connector 16a and the third connector 16a through a plurality of conductive bumps 28. Thereafter, in step S18, as shown in FIG. 1H, an underfill layer 29 is formed to fill a space between the bridge 27 and the first die 18a, and between the bridge 27 and the second die 18b.

In some embodiments of the disclosure, the two dies are electrically connected through the bridge and the RDL structure. As some of the connectors of the dies are connected through the bridge, the number of the layers of the RDLs of the RDL structure may be reduced. In addition, the dielectric layer has a full opening at bridge joint area, such that the joint widow of the conductive bump and the connector of the die is enlarged. Therefore, a better connection between the conductive bump and the connector is achieved.

In accordance with some embodiments of the disclosure, a package structure including a first die, a second die, a first encapsulant, a bridge, an underfill layer and a RDL structure is provided. The first die and the second die are placed side by side. The first encapsulant encapsulates sidewalls of the first die and sidewalls of the second die. The bridge electrically connects the first die and the second die through two conductive bumps. The underfill layer fills the space between the bridge and the first die, between the bridge and the second die, and between the bridge and a portion of the first encapsualnt. The RDL structure is located over the bridge and electrically connected to the first die and the second die though a plurality of TIVs. The bottom surfaces of the two conductive bumps are level with a bottom surface of the underfill layer.

In accordance with alternative embodiments of the disclosure, a package structure including a first die, a second die, a first encapsualnt, a bridge and an underfill layer is provided. The first die and the second die are placed side by side. The first encapsulant encapsulates sidewalls of the first die and sidewalls of the second die. The bridge electrically connects the first die and the second die. The underfill layer is disposed between the bridge and the first die, between the bridge and the second die, and between the bridge and a portion of the first encapsulant. At least a portion of the underfill layer is in contact with a portion of a top surface of the first die and a portion of a top surface of the second die.

In accordance with some embodiments of the disclosure, a method of manufacturing a package structure is provided, and the method includes the following steps. An encapsulant is formed aside a first die and a second die to encapsulate sidewalls of the first die and sidewalls of the second die. A dielectric layer is formed on the first die, the second die and the encapsulant. The dielectric layer is patterned to form at least one first opening and a plurality of second openings. The at least one first opening exposes a top surface of a first connector of the first die, and a top surface of a third connector of the second die. The plurality of the second openings exposes a portion of a top surface of a second connector of the first die, and a portion of a top surface of a fourth connector of the second die. A bridge is placed over and electrically connected to the first connector and the third connector through a plurality of conductive bumps. An underfill layer is formed to fill a space between the bridge and the first die, and between the bridge and the second die. A width of the at least one first opening is larger than a width of the first connector, and larger than a width of the third connector.

The foregoing outlines features of several embodiments so that those skilled in the art may better understand the aspects of the disclosure. Those skilled in the art should appreciate that they may readily use the disclosure as a basis for designing or modifying other processes and structures for carrying out the same purposes and/or achieving the same advantages of the embodiments introduced herein. Those skilled in the art should also realize that such equivalent constructions do not depart from the spirit and scope of the disclosure, and that they may make various changes, substitutions, and alterations herein without departing from the spirit and scope of the disclosure.

What is claimed is:

1. A package structure, comprising:
   a first die and a second die side by side;
   a first encapsulant, encapsulating sidewalls of the first die and sidewalls of the second die;
   a bridge, electrically connecting the first die and the second die through two conductive bumps;
   an underfill layer, filling the space between the bridge and the first die, between the bridge and the second die, and between the bridge and a portion of the first encapsulant;
   a second encapsulant over the first die and the second die, encapsulating sidewalls of the underfill layer and sidewalls of the bridge;
   a dielectric layer, sandwiched between the first die and the second encapsulant, and between the second die and the second encapsulant; and a redistribution layer (RDL) structure over the bridge, electrically connected to the first die and the second die though a plurality of through integrated fan-out vias (TIVs), wherein bottom surfaces of the two conductive bumps are level with a bottom surface of the underfill layer.

2. The package structure of claim 1,
wherein:
the dielectric layer is aside the underfill layer and covering a portion of a top surface of the first encapsulant, a portion of a top surface of the first die and a portion of a top surface of the second die;
the second encapsulant further encapsulates sidewalls of the plurality of the TIVs, and
the two conductive bumps are surrounded by the underfill layer, and are separated from the dielectric layer by the underfill layer.

3. The package structure of claim 2, wherein the bottom surface of the underfill layer is level with a bottom surface of the dielectric layer.

4. The package structure of claim 2, wherein the plurality of the TIVs penetrates through the dielectric layer to be in electric contact with the first die and the second die.

5. The package structure of claim 4, wherein top surfaces of the TIVs are level with a top surface of the bridge.

6. The package structure of claim 2, wherein
top surfaces of the two conductive bumps are in contact with the bridge;
bottom surfaces of the two conductive bumps are respectively in contact with the first die and the second die; and
a width of the top surface of one of the two conductive bumps is less than a width of the bottom surface of the one of the two conductive bumps.

7. The package structure of claim 2, wherein
the first die comprises a first connector and a second connector;
the second die comprises a third connector and a fourth connector;
the first connector and the third connector are connected through the bridge; and
the second connector and the fourth connector are connected through the plurality of the TIVs and the RDL structure.

8. The package structure of claim 7, wherein
a width of the first connector is less than a width of the second connector, and a width of the third connector is less than a width of the fourth connector, and
portions of top surfaces of the second connector and the fourth connector are covered by the dielectric layer, and top surfaces of the first connector and the third connector are not covered by the dielectric layer.

9. The package structure of claim 1, wherein the bridge comprises an interconnection structure.

10. A package structure, comprising:
a first die and a second die side by side;
a first encapsulant, encapsulating sidewalls of the first die and sidewalls of the second die;
a bridge, electrically connecting the first die and the second die;
an underfill layer between the bridge and the first die, between the bridge and the second die, and between the bridge and a portion of the first encapsulant,
a second encapsulant over the first die and the second die, encapsulating sidewalls of the underfill layer and sidewalls of the bridge; and a dielectric layer, sandwiched between the first die and the second encapsulant, and between the second die and the second encapsulant,
wherein at least a portion of the underfill layer is in contact with a portion of a top surface of the first die and a portion of a top surface of the second die.

11. The package structure of claim 10, wherein the first encapsulant between the first die and the second die is covered and in contact with the underfill layer.

12. The package structure of claim 10, wherein the dielectric layer is further disposed between the underfill layer and a portion of the first encapsulant between the first die and the second die.

13. The package structure of claim 10, wherein the underfill layer is in contact with a portion of a first passivation layer around a first connector of the first die, and a portion of a second passivation layer around a second connector of the second die.

14. The package structure of claim 10, further comprising:
a plurality of TIVs aside the bridge and the underfill layer, electrically connected to the first die and the second die, and the second encapsulant further encapsulates sidewalls of the plurality of the TIVs;
and
a RDL structure over the second encapsulant, the TIVs and the bridge, electrically connected to the first die and the second die through the plurality of the TIVs.

15. The package structure of claim 10, further connected to another package structure to form a package-on-package (PoP) device.

16. A method of manufacturing a package structure, comprising:
forming a first encapsulant aside a first die and a second die, encapsulating sidewalls of the first die and sidewalls of the second die;
forming a dielectric layer on the first die, the second die and the first encapsulant;
patterning the dielectric layer to form at least one first opening and a plurality of second openings, wherein the at least one first opening exposes a top surface of a first connector of the first die, and a top surface of a third connector of the second die, wherein the plurality of the second openings exposes a portion of a top surface of a second connector of the first die, and a portion of a top surface of a fourth connector of the second die;
placing a bridge over and electrically connecting the first connector and the third connector through a plurality of conductive bumps;
forming an underfill layer, filling a space between the bridge and the first die, and between the bridge and the second die; and
forming a second encapsulant over the first die, the second die and the dielectric layer, encapsulating sidewalls of the underfill layer and sidewalls of the bridge,
wherein the dielectric layer is sandwiched between the first die and the second encapsulant, and between the second die and the second encapsulant,
wherein a width of the at least one first opening is larger than a width of the first connector, and larger than a width of the third connector.

17. The method of claim 16, further comprises:
forming a plurality of TIVs on the second connector and on the fourth connector exposed by the second openings of the dielectric layer; and forming a RDL structure over the bridge, electrically connected to the second connector and the fourth connector through the plurality of the TIVs.

18. The method of claim 16, wherein the at least one first opening further exposing a top surface of the first encapsulant between the first die and the second die.

19. The method of claim 16, wherein the at least one first opening comprising two openings respectively exposing a top surface of the first connector and a top surface of the third connector.

20. The method of claim 16, wherein the underfill layer is formed with a bottom surface level with a bottom surface of the dielectric layer.

* * * * *